United States Patent
Lee et al.

(10) Patent No.: US 10,559,688 B2
(45) Date of Patent: Feb. 11, 2020

(54) TRANSISTOR WITH THERMAL PERFORMANCE BOOST

(71) Applicant: INTEL CORPORATION, Santa Clara, CA (US)

(72) Inventors: Chen-Guan Lee, Portland, OR (US); Walid M. Hafez, Portland, OR (US); Joodong Park, Portland, OR (US); Chia-Hong Jan, Portland, OR (US); Hsu-Yu Chang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/081,215

(22) PCT Filed: Apr. 1, 2016

(86) PCT No.: PCT/US2016/025602
§ 371 (c)(1),
(2) Date: Aug. 30, 2018

(87) PCT Pub. No.: WO2017/171844
PCT Pub. Date: Oct. 5, 2017

(65) Prior Publication Data
US 2019/0027604 A1  Jan. 24, 2019

(51) Int. Cl.
*H01L 29/78* (2006.01)
*H01L 29/66* (2006.01)

(52) U.S. Cl.
CPC .... *H01L 29/7846* (2013.01); *H01L 29/66545* (2013.01); *H01L 29/66795* (2013.01); *H01L 29/785* (2013.01)

(58) Field of Classification Search
CPC ............... H01L 29/7846; H01L 29/785; H01L 29/66795; H01L 29/66545
See application file for complete search history.

(56) References Cited

U.S. PATENT DOCUMENTS

| | | | | |
|---|---|---|---|---|
| 4,603,341 A | * | 7/1986 | Bertin | ................. H01L 21/8221 257/70 |
| 2008/0020531 A1 | | 1/2008 | Williams et al. | |

(Continued)

FOREIGN PATENT DOCUMENTS

WO    2017/171844 A1    10/2017

OTHER PUBLICATIONS

International Search Report and Written Opinion received for PCT Application No. PCT/US2016/025602. dated Dec. 20, 2016. 14 pages.

(Continued)

*Primary Examiner* — Mark V Prenty
(74) *Attorney, Agent, or Firm* — Finch & Maloney PLLC

(57) ABSTRACT

Techniques are disclosed for forming a transistor with enhanced thermal performance. The enhanced thermal performance can be derived from the inclusion of thermal boost material adjacent to the transistor, where the material can be selected based on the transistor type being formed. In the case of PMOS devices, the adjacent thermal boost material may have a high positive linear coefficient of thermal expansion (CTE) (e.g., greater than 5 ppm/° C. at around 20° C.) and thus expand as operating temperatures increase, thereby inducing compressive strain on the channel region of an adjacent transistor and increasing carrier (e.g., hole) mobility. In the case of NMOS devices, the adjacent thermal boost material may have a negative linear CTE (e.g., less than 0 ppm/° C. at around 20° C.) and thus contract as operating temperatures increase, thereby inducing tensile strain on the channel region of an adjacent transistor and increasing carrier (e.g., electron) mobility.

20 Claims, 7 Drawing Sheets

(56) References Cited

U.S. PATENT DOCUMENTS

| | | |
|---|---|---|
| 2010/0123197 A1 | 5/2010 | Jin |
| 2011/0079859 A1 | 4/2011 | Oh et al. |
| 2014/0357040 A1 | 12/2014 | Loubet et al. |
| 2015/0118823 A1 | 4/2015 | Nier et al. |
| 2015/0325575 A1 | 11/2015 | Park et al. |

OTHER PUBLICATIONS

International Preliminary Report on Patentability received for PCT Application No. PCT/US2016/025602. dated Oct. 2, 2018. 10 pages.
Extended European Search Report received for EP Application No: 16897384.0, dated Oct. 2, 2019. 7 pages.

* cited by examiner

TRANSISTOR WITH THERMAL PERFORMANCE BOOST

BACKGROUND

Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include side-wall or so-called gate spacers on either side of the gate that can help determine the channel length and can help with replacement gate processes, for example. Complementary MOS (CMOS) structures typically use a combination of p-type MOSFETs (p-MOS) and n-type MOSFETs (n-MOS) to implement logic gates and other digital circuits.

A finFET is a transistor built around a thin strip of semiconductor material (generally referred to as a fin). The transistor includes the standard FET nodes, including a gate, a gate dielectric, a source region, and a drain region. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. Tri-gate transistors are one example of non-planar transistor configurations, and other types of non-planar configurations are also available, such as so-called double-gate transistor configurations, in which the conductive channel principally resides only along the two sidewalls of the fin (and not along the top of the fin). Another non-planar transistor configuration is a gate-all-around configuration, which is configured similarly to a fin-based transistor, but instead of a finned channel region where the gate is on three portions (and thus, there are three effective gates), one or more nanowires (or nanoribbons) are used and the gate material generally surrounds each nanowire.

Figure 1A:
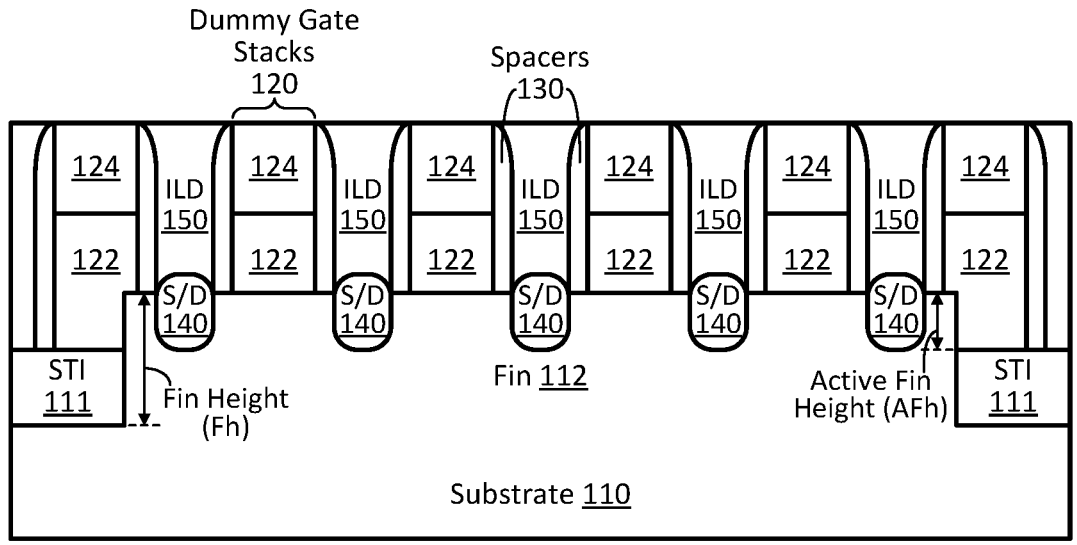
FIGS. 1A-F illustrate example integrated circuit structures resulting from a method configured to form transistors including enhanced thermal performance, in accordance with some embodiments of this disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming a transistor with enhanced thermal performance. The enhanced thermal performance can be derived from the inclusion of thermal boost material adjacent to the transistor, where the material is selected based on the transistor type being formed. For example, the thermal boost material may derive its thermal enhancement properties as a result of its expansion or contraction as an integrated circuit's operating temperature increases. Such expansion or contraction tends to cause strain on the channel region of the nearby transistor as operating temperatures increase, resulting in increased carrier mobility in that channel region. In the case of p-type MOSFET (PMOS) devices, thermal boost materials with a relatively high positive linear coefficient of thermal expansion (CTE), such as greater than 5 ppm/° C. at around 20° C., may be used to induce compressive strain to the channel region of an adjacent transistor as operating temperatures increase. In the case of n-type MOSFET (NMOS) devices, thermal boost materials with a negative linear CTE, such as less than 0 ppm/° C. at around 20° C., may be used to induce tensile strain to the channel region of an adjacent transistor as operating temperatures increase. Thus, the techniques disclosed herein can be used to improve transistor and circuit performance at relatively high operating temperatures, such as greater than 30° C., or greater than 40° C., or greater than 50° C. (or in a more general sense, higher than 25° C.), and may at least partially compensate for temperature induced mobility degradation. Numerous variations and configurations will be apparent in light of this disclosure.

General Overview

Numerous non-trivial challenges are present in fabricating semiconductor transistors, particularly as the industry attempts to keep up with Moore's law. For instance, the mobility of carriers (e.g., electrons or holes) in a transistor channel degrades with increasing temperature due to lattice scattering events, for example. As a result, such transistor devices operating at relatively high temperatures (e.g., greater than 30° C. in some cases, or greater than 40° C. or even 50° C. in still other cases, depending on factors such as the power being dissipated by the transistor devices as well as the temperature of the environment in which the transistor devices are operating) have degraded performance. Having high performance integrated circuit devices at high operating temperatures may be important in some applications, such as monitoring devices in oil rigs or servers, for example. Maintaining high performance integrated circuits at a wide range of temperatures may also be important for some applications, such as military and space exploration applications, for example.

Thus, and in accordance with one or more embodiments of this disclosure, techniques are provided for forming a transistor with enhanced thermal performance. In some embodiments, the enhanced thermal performance is derived from the inclusion of thermal boost material adjacent to the transistor that has thermal properties selected based on the transistor type being formed. For example, the thermal boost material may derive its thermal enhancement properties as a result of its expansion or contraction as an integrated circuit's operating temperature increase. Such expansion or contraction may cause strain on the channel region of the nearby transistor as operating temperatures increase, resulting in increased carrier mobility in that channel region. In some instances, the thermal boost material may at least partially compensate for the temperature induced mobility degradation caused in a transistor channel as operating temperatures increase. Note that, in some embodiments, the adjacent relationship between the thermal boost material and the target transistor includes, for instance, being directly adjacent such that the thermal boost material is in contact with and touching a transistor feature (e.g., in direct contact with source and/or drain material). In other embodiments, adjacent is intended to include some intervening material located between the thermal boost material and the nearest transistor feature (e.g., the source or drain region), such that the strain induced by the thermal expansion/contraction of the boost material is transferred to the transistor feature by the intervening material. The intervening material may include, for example, substrate material, fin material, spacer material, inter-layer dielectric (ILD) material, and/or a material selected specifically for its ability to transfer strain, to name some examples. In other words, adjacent as used herein can include being immediately adjacent to and in direct physical contact with, or adjacent can include being in indirect physical contact with by virtue of one or more intervening layers that transfer heat-induced strain.

In some embodiments, the thermal boost material described herein may be selected to have a high positive linear coefficient of thermal expansion (CTE), such that it expands as temperatures increase. In some such embodiments, the expansion may induce compressive strain in a nearby p-type transistor channel (e.g., for a PMOS device) and thereby improve carrier mobility (e.g., hole mobility). In some embodiments, a high positive linear CTE may include linear CTE values greater than 4, 5, 6, 7, 8, 9, 10, 15, or 20 ppm/° C. (e.g., at around 20° C., where around 20° C. includes plus or minus 10° C. from 20° C. or 10-30° C.), or some other suitable threshold CTE value, depending on the end use or target application. For example, suitable materials having high positive linear CTE may include aluminum oxide (or alumina), aluminum nitride, porous oxide, sapphire, and/or beryllium oxide (or beryllia), to name some examples. In some embodiments, the high positive linear CTE material may be an oxide material having a linear CTE value of greater than 5 ppm/° C. at around 20° C. Note that the units of CTE of ppm/° C. may be expressed in another suitable manner, such as ppm/K, 10E−6/° C., 10E−6/K, (μm/m)/° C., or (μm/m)/K, for example.

In some embodiments, the high positive linear CTE thermal boost materials may be selected to have a higher linear CTE than standard materials used for isolation in the channel direction (e.g., along a fin in a finFET configuration) for other transistors formed on the same chip or integrated circuit. Such standard materials used for isolation include silicon nitride and silicon carbide, for example, which have linear CTEs of around 2-4 ppm/° C. Therefore, in some embodiments, high linear CTE thermal boost materials may be selected to have a relative linear CTE value that is at least 1, 1.5, 2, 2.5, 3, 3.5, 4, 4.5, or 5 ppm/° C. (e.g., at around 20° C.) higher than standard isolation material used elsewhere on the same chip or integrated circuit. In an example embodiment, the high linear CTE thermal boost material may be alumina (CTE of at least approximately 6 ppm/° C. at around 20° C.) or beryllia (CTE of at least approximately 6.5 ppm/° C. at around 20° C.), and the standard isolation material may be silicon carbide (CTE of approximately 3 ppm/° C. at around 20° C.), such that the thermal boost material is at least 3 ppm/° C. at around 20° C. higher than the standard isolation material used for isolation (in the channel direction or source-to-drain direction) of other transistors on the same chip. Note that while standard isolation materials, such as silicon nitride and silicon carbide, may expand as operating temperatures increase, such expansion is less than the expansion of high positive linear CTE thermal boost materials described herein at the same high operating temperatures. Therefore, to the extent that standard isolation materials transfer compressive strain to the channel region of nearby transistors as operating temperature increases, such strain is less than that caused by the high positive linear CTE thermal boost materials described herein. In other words, the channel carrier mobility benefits derived from the increased compressive strain on target transistors caused by adjacent high positive linear CTE thermal boost materials described herein would not be realized by transistors that are only adjacent to standard isolation materials.

In some embodiments, the thermal boost material may be selected to have a negative linear CTE, such that it contracts as operating temperature increases. In some such embodiments, the contraction may induce tensile strain in a nearby n-type transistor channel (e.g., for an NMOS device) and thereby improve carrier mobility (e.g., electron mobility). In some such embodiments, a negative linear CTE may include linear CTE values less than 0 ppm/° C. (e.g., at around 20° C., where around 20° C. includes plus or minus 5° C. from 20° C. or 15-25° C.), depending on the end use or target application. For example, suitable materials having negative linear CTE may include hafnium tungstate, hafnium molybdate, zirconium tungstate (or cubic zirconium tungstate), zirconium molybdate, and/or zirconium vanadate, to name some examples. In some embodiments, the negative linear CTE thermal boost materials may be selected to have a lower linear CTE than standard materials used for isolation in the channel direction (e.g., along a fin in a finFET configuration) for other transistors formed on the same chip or integrated circuit. As previously described, such standard materials used for isolation include silicon nitride and silicon carbide, for example, which have linear CTEs of around 2-4 ppm/° C. Therefore, in some embodiments, negative linear CTE thermal boost materials may be selected to have a linear CTE value that is at least 1, 2, 3, 4, or 5 ppm/° C. (e.g., at around 20° C.) lower than standard isolation material used elsewhere on the same chip or integrated circuit. In some embodiments, the techniques described herein may be used to enhance the thermal performance of one or both of PMOS and NMOS devices included in a CMOS device.

Numerous benefits of the techniques described herein will be apparent in light of this disclosure. For example, as previously described, in some embodiments, the thermal boost material may be selected such that it expands or contracts as the operating temperature increases to induce strain on the transistor channel region and change carrier mobility, thereby improving transistor and circuit performance. In some embodiments, the techniques may be used to improve transistor and circuit performance at high operating temperatures, such as at temperatures greater than 40, 50, 60, 70, 80, 90, 100, 125, 150, 175, or 200° C., or above some other suitable value, depending on the end use or target application. For instance, having high performance circuitry at high operating temperatures may be critical in applications such as monitoring devices in oil rigs or servers, military applications, and space exploration applications, to name some examples. In a more general sense, the techniques provided herein can be used to implement transistor-based integrated circuitry for any application where at least one of the circuitry operating temperature and the ambient temperature of the environment in which the circuitry operates is in excess of a given temperature threshold sufficient to cause the boost material to exert increased strain in the channel region. Note that the circuitry operating temperature may be with respect to, for example, the overall die temperature, or localized hot spots of the die. Further note that the ambient temperature of the environment may refer to an average environment or other statistically relevant temperature taken during the overall operating time, or such a temperature measurement taken during a specific period of time during that overall operating time (e.g., during a relatively hot portion of the environment temperature cycle). In some embodiments, and as will be further appreciated the techniques may be used to improve transistor and circuit performance at high operating gate voltages, such as at voltages greater than 1.5, 1.8, 2.5, 3.3, or 5 V, or above some other suitable value, depending on the end use or target application.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a structure or device configured with thermal boost material either directly or indirectly adjacent to a transistor as described herein. In some such embodiments, composition mapping or other suitable techniques can be used to identify the materials of the structure at issue, and the known linear CTE values of those materials (e.g., determined by looking up the identified materials' properties) may be used to determine whether thermal boost materials as described herein are present. Note that the thermal boost material described herein is distinguishable from other standard isolation materials. In some instances, the techniques may be identified by taking a cross-section of an integrated circuit structure to identify a transistor and adjacent thermal boost material as described herein, where the cross-section is taken at the transistor channel region, perpendicular to the gate stack. In other words, in the case of a finned transistor configuration, the cross-sectional view may be taken along a single fin. In some such embodiments, the thermal boost material may include a linear CTE value that is either a high positive value (e.g., greater than 4, 5, 6, or 7 ppm/° C. at around 20° C.) or a negative value (e.g., less than 0 ppm/° C. at around 20° C.). In some embodiments, the thermal boost material may be adjacent to one or both of a transistor's source/drain (S/D) regions, where adjacent includes being directly adjacent (e.g., in physical contact with) or nearby such that one or more other materials (e.g., 1-3 materials) may be located between the thermal boost material and the adjacent S/D region material. In some such embodiments, the adjacent S/D region may be located between the thermal boost material and the transistor channel region. In some embodiments, the techniques described herein may be detected by measuring the benefits achieved, such as the transistor or circuit performance improvement obtained at high operating temperatures, for example. Numerous configurations and variations will be apparent in light of this disclosure.

Architecture and Methodology

FIGS. 1A-F illustrate example integrated circuit structures resulting from a method configured to form transistors including enhanced thermal performance, in accordance with some embodiments of this disclosure. The illustrations provided in FIGS. 1A-F are shown as orthogonal to a fin structure used to form one or more transistors. As can be understood based on the present disclosure, FIGS. 1A-F illustrate cross-sections of the gate stacks used to form one or more transistors. Such cross-sectional views may be achieved, for example, using SEM, TEM, or STEM. Note that although the integrated circuit structures are primarily depicted in the context of forming transistors having a non-planar finned configuration (e.g., finFET or tri-gate), the present disclosure is not intended to be so limited. For example, in some embodiments, the techniques described herein can be used to form integrated circuits including transistors having a planar configuration or other non-planar configurations such as a dual-gate configuration or a gate-all-around configuration (e.g., including one or more nanowires or nanoribbons). Further, in some embodiments, the techniques can be used to form integrated circuits including p-type and/or n-type transistor devices, such as p-type MOSFET (PMOS), n-type MOSFET (NMOS), p-type tunnel FET (PTFET), and/or n-type TFET (NTFET), to name some examples. Further yet, in some embodiments, the techniques may be used to benefit either or both of p-type and n-type transistors included in complementary MOS (CMOS) or complementary TFET (CTFET) devices, for example. Further still, in some embodiments, the techniques may be used to benefit devices of varying scales, such as transistor devices having critical dimensions in the micrometer range or in the nanometer range (e.g., transistors formed at the 32, 22, 14, 10, 7, or 5 nm process nodes, or beyond).

FIG. 1A illustrates an example integrated circuit structure after processing for a finned transistor has been performed, where the processing included fin formation on a substrate, dummy gate formation, spacer formation, and source/drain (S/D) formation. As shown, the example structure includes substrate 110, shallow trench isolation (STI) material 111, fin 112, dummy gate stacks 120, spacers 130 on either side of each dummy gate stack 120, S/D regions 140, and interlayer dielectric material 150. In this example embodiment, the processing used to form the example structure of FIG. 1A included the formation of fin 112 and STI material 111, which may include etching to form STI trenches and one or more fins (including fin 112 having fin height Fh), depositing STI material 111 in the STI trenches, optionally planarizing and/or polishing the STI material 111, and recessing the STI material 111 to cause a portion of fin 112 to be exposed and protrude above the STI material 111 (the portion having active fin height AFh). The STI material 111 shown in the example structure of FIG. 1A is at the end of fin 112, but as can be understood, the STI material would also be on either side of fin 112 in this example embodiment (e.g., behind fin 112 going into the page and in front of fin 112 coming out of the page). In other embodiments, other suitable processing may be used to form fin 112. Deposition or growth processes used to form the example structure of FIG. 1A may include any suitable techniques, such as chemical vapor deposition (CVD), atomic layer deposition (ALD), physical vapor deposition (PVD), and/or any other suitable process.

In the example embodiment of FIG. 1A, fin 112 is native to substrate 110; however, that need not be the case. For instance, in some embodiments, fin 112 may be formed on substrate 110 and formed from different material than substrate 110 using any suitable replacement fin processing, such as aspect ratio trapping (ART) processing, for example. Although only one fin 112 is shown in the example structure of FIG. 1A, any number of fins may have been formed on and/or from substrate 110, such as two, three, four, five, ten, fifty, hundreds, thousands, millions, and so forth, depending on the end use or target application. In some embodiments, the fins formed, including fin 112, may have varying heights Fh and widths (the dimension of the fin going into and coming out of the cross-sectional view shown in FIG. 1A). For example, in embodiments employing ART processing, the fins may be formed to have particular height to width ratios such that if they are later removed or recessed, the resulting trenches formed allow for defects in the replacement material deposited (for replacement fins) to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio (h:w) of the fins may be greater than 1, such as greater than 1.5, 2, or 3, or any other suitable minimum ratio, for example. In addition, the portion of fin that protrudes above the STI material 111, referred to as the active fin height (AFh) may be any suitable height, depending on the end use or target application. Note that the portion of the fin height Fh of fin 112 that is below the top of the STI material 111 may be referred to as the sub-fin portion, for example.

In some embodiments, substrate 110 may include: a bulk substrate including a group IV material, such as silicon (Si), germanium (Ge), SiGe, or silicon carbide (SiC), and/or at least one group III-V material and/or sapphire and/or any other suitable material(s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Although substrate 110, in this example embodiment, is shown as having a thickness (the vertical dimension) similar to the other features for ease of illustration, in some instances, substrate 110 may be much thicker than the other features, such as having a thickness in the range of 50 to 950 microns, for example. In some embodiments, substrate 110 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

Formation of the dummy gate stacks 120, in this example embodiment, included dummy gate oxide deposition (not shown), and dummy gate electrode 122 deposition (e.g., dummy poly-Si deposition), for example. Note that gate dummy gate oxide is located under dummy gate electrode material 122, in this example embodiment. Hardmask material 124 was also deposited on the dummy gate electrode material 122, in this example embodiment. Such deposition processes may include any suitable deposition techniques, such as chemical vapor deposition (CVD), atomic layer deposition (ALD), physical vapor deposition (PVD), and/or any other suitable process, depending on the dummy gate being formed. Additional processing may include patterning the dummy gate and hardmask material to form the shape shown, for example, and then forming spacers 130 on either side of each dummy gate stack 120. Spacer 130 formation may be performed using any suitable techniques. The material of spacers 130, in some embodiments, may include any suitable materials, such as dielectric materials, oxides (e.g., a silicon oxide material), and/or nitrides (e.g., a silicon nitride material). As can be understood based on this disclosure, one or more of the dummy gate stacks 120 (including hardmask material 124) may be used as sacrificial structures, which may allow for the formation of other components. As can also be understood, the dummy gate stack material may protect the channel region (e.g., the surface under the gate stacks) during subsequent processing, such as during the subsequent removal of one or more dummy gate stacks to form etched regions 160 described herein or during the subsequent removal of one or more dummy gate stacks to be replaced with the final gate stack 180 as described herein. Note that dummy gate material (e.g., dummy oxide) can help protect the underlying fin or channel region material when removing dummy gate material 122. Also note that although the techniques in this example embodiment are primarily illustrated and described herein in the context of a gate last process flow, in some embodiments, the techniques may be performed in a gate first process flow, such that the thermal boost material is deposited prior to S/D 140 processing, for example, or at any other suitable stage of the transistor fabrication process flow.

As can be seen in this example embodiment, S/D regions 140 may have been formed by etching out a portion of substrate 110 and depositing (or growing or regrowing) the S/D region 140 material, using, for example an epitaxial deposition process such as CVD, metal-organic chemical vapor deposition (MOCVD), or molecular-beam epitaxy (MBE), to name some example processes. In some embodiments, the source/drain epitaxial regions may be grown after performing an etch-under-cut (EUC) process. In some such embodiments, the S/D regions 140 may extend under spacers 130 and/or under dummy gate stacks 120, and such extended portions may be referred to as S/D tips or extensions, for example. In some embodiments, the S/D regions may be completely in the substrate, may be a portion of the substrate (e.g., including doping or other suitable alteration), may be over the substrate, or any combination thereof. For example, in some embodiments, the S/D region 140 material may be native to substrate 110 and may or may not include doping (e.g., via implantation), or the S/D region 140 material may be formed using replacement material, which may or may not include removing a portion of the substrate to form S/D trenches for deposition/growth of the replacement S/D regions 140. The techniques described herein are not intended to be limited to any specific S/D configuration unless otherwise stated.

In some embodiments, S/D regions 140 may include any suitable materials and suitable dopants, depending on the end use or target application. For example, in an embodiment where substrate 110 includes silicon and the transistor device is configured to be PMOS, S/D regions 140 may both include p-type doped silicon (e.g., where boron is the p-type dopant). In another example embodiment, where substrate 110 includes silicon and the transistor device is configured to be NMOS, S/D regions 140 may both include n-type doped silicon (e.g., where phosphorus is the n-type dopant). In some embodiments, any suitable S/D 140 material and optional doping schemes may be used, depending on the end use or target application. For example, in TFET configurations, the source and drain regions 140 may be oppositely type doped (e.g., source is p-type doped and drain is n-type doped, or vice versa), with the channel region being minimally doped or undoped (or intrinsic/i-type). In some embodiments, S/D regions 140 may include a multi-layer structure of two or more material layers. In some embodiments, S/D regions 140 may include grading (e.g., increasing and/or decreasing) the content of one or more materials in at least a portion of the regions 140. For instance, in some embodiments, a passivation material may be deposited prior to the deposition of the primary S/D material to assist with the quality of the interface between the S/D material and the substrate material, for example, depending on the end use or target application. Further, in some embodiments, a contact-improving material may be formed on the top of the S/D region material to assist with making contact to S/D contacts 142 (described below), for example, depending on the end use or target application. In the example structure of FIG. 1A, ILD material 150 (e.g., silicon dioxide or a low k dielectric material) has been deposited over S/D regions 140 to help protect the S/D regions 140 during subsequent processing and the structure was planarized.

Figure 1B:
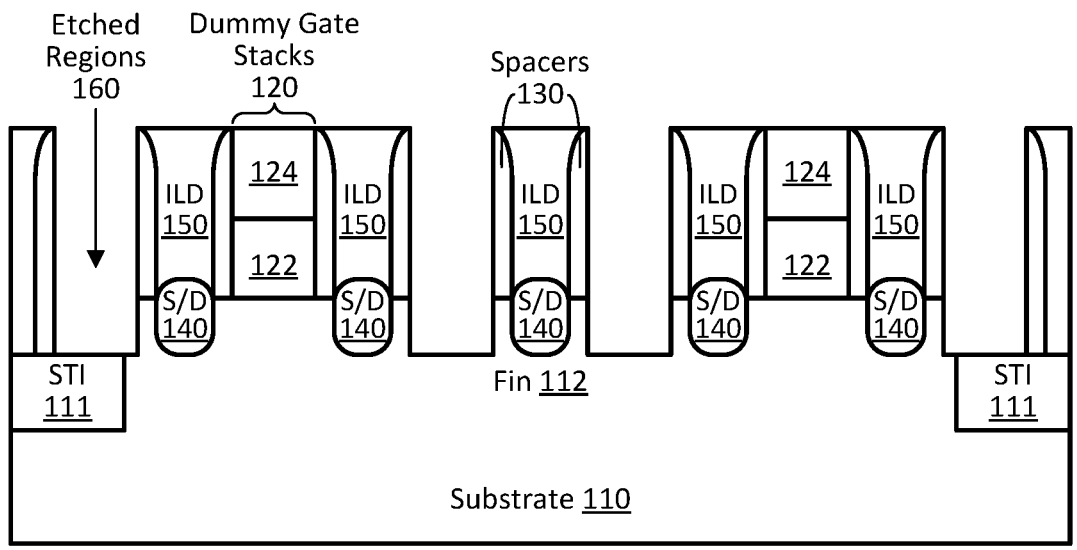

FIG. 1B illustrates an example structure after etching some of the dummy gate stacks 120 from the structure of FIG. 1A to remove them and also etching a portion of fin 112 below those dummy gate stacks 120 to form etched regions 160, in accordance with an embodiment. In other words, in this example embodiment, the etch is performed on the dummy gate materials (including dummy gate dielectric/oxide, dummy gate material 122 and hardmask material 124, in this example case) such that the end-to-end regions are removed and then fin 112 is cut to isolate devices in the fin direction. In this example embodiment, four etched regions 160 were formed, and such regions may also be referred to as fin trench isolation (FTI) regions. In this example embodiment, the etched or FTI regions 160 may have been formed include using any suitable wet and/or dry etch processes, or any other suitable techniques. Note that, in this example embodiment, etched regions 160 extend down into fin 112 and to a level that is even with the base of S/D regions 140; however, that need not be the case. For example, in some embodiments, the etch process(es) performed may form etched regions 160 that extend to a level that is above or below the base of S/D regions 140. In some embodiments, it may be desired to form etched regions 160 such that they extend below the base level of S/D regions 140, to help ensure, for example, that subsequently deposited thermal boost material is adjacent to at least the entirety of the height of the channel regions (e.g., regions 192 and 194 in FIG. 1F). Further, in some embodiments, the processing may not form consistent etched regions 160, whether desired or as a result of real-world fabrication, such that some etched regions 160 may be deeper than others. Also note that, in this example embodiment, the bottom of each etched region 160 is flat; however, that need not be the case. For example, in some embodiments, the bottom of etched regions 160 may include faceting, such as {111} faceting, which is generally triangular in shape, or some other suitable shape at the bottom of the etched region, such as curved faceting, for instance.

Figure 1C:
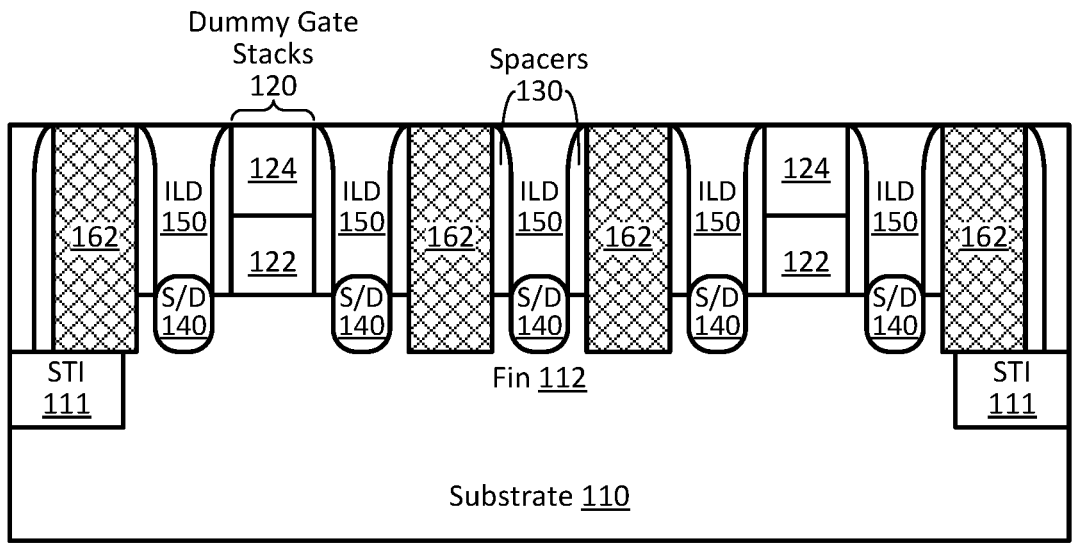

FIG. 1C illustrates an example structure after depositing sacrificial material 162 in the etched regions 160 of the structure of FIG. 1B and planarized, in accordance with an embodiment. The sacrificial material 162 may be used for easy removal when replacing it with thermal boost material, and in some cases, with isolation materials, as will be described herein. In some embodiments, sacrificial material 162 may be any suitable material, such as carbon hardmask (CHM) material, for example. In some embodiments, sacrificial material 162 may be selected based on the ILD material 150, such that sacrificial material 162 can be selectively etched relative to that ILD material 150, for example. Selectively etching or removing sacrificial material 162 may include any suitable wet and/or dry etch processes. As can be seen in the structure of FIG. 1C, the previously etched regions 160 containing sacrificial material 162 (to be subsequently removed and replaced) are on either side of the two remaining dummy gate stacks 120. As will be apparent in light of the present disclosure, the remaining dummy gate stacks 120 will be used to form two transistors, as will be described herein.

Figure 1D:
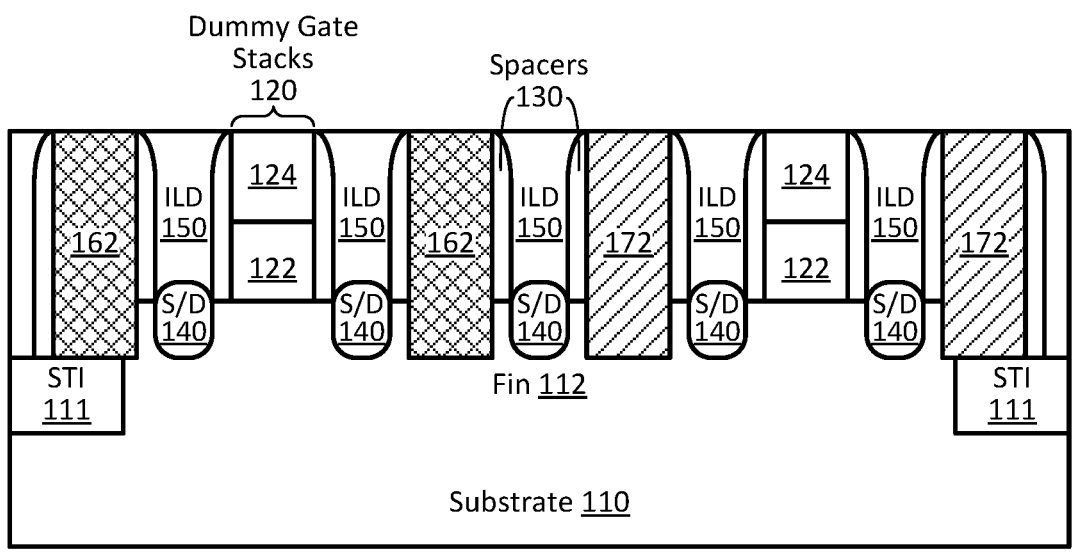
Figure 1E:
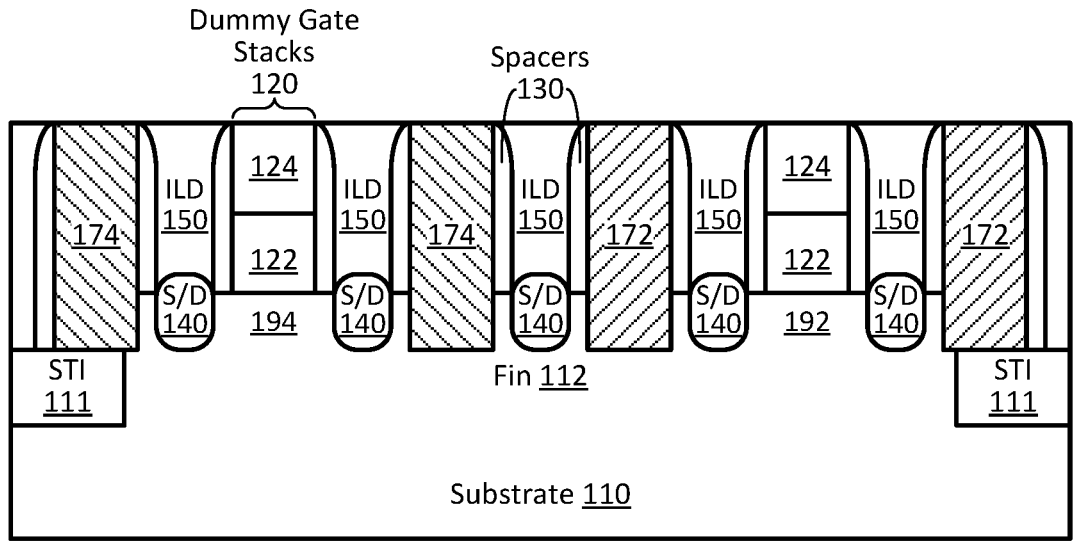

FIG. 1D illustrates an example structure after sacrificial material 162 adjacent to the right dummy gate stack 120 in the structure of FIG. 1C was removed and replaced with thermal boost material 172, in accordance with an embodiment. FIG. 1E illustrates an example structure after sacrificial material 162 adjacent to the left dummy gate stack 120 in the structure of FIG. 1D was removed and replaced with material 174, in accordance with an embodiment. In this example embodiment, processing to remove and replace sacrificial material 162 with material 172 or 174 may include optionally patterning hardmask on sacrificial material 162 in regions not to be removed, performing wet and/or dry etch processes to remove sacrificial material 162 from the regions intended to be removed, depositing the replacement material, and optionally planarizing and/or polishing, and then repeating the process as many times as desired to deposit as many replacement materials as desired, for example. In some embodiments, sacrificial material 162 need not be used, such that the material 172 and/or 174 as variously described herein may be deposited in the etched regions 160 of the structure of FIG. 1B. For instance, in some such embodiments, dummy gate stacks 120 may be removed and replaced with material 172 and/or 174, using similar processing used for replacing sacrificial material 162. However, in some embodiments, the use of sacrificial material 162 may assist with the removal and replacement material processing, particularly where two or more replacement materials are being used on the same integrated circuit structure. Materials 172 and 174 will be described in more detail below.

Figure 1F:
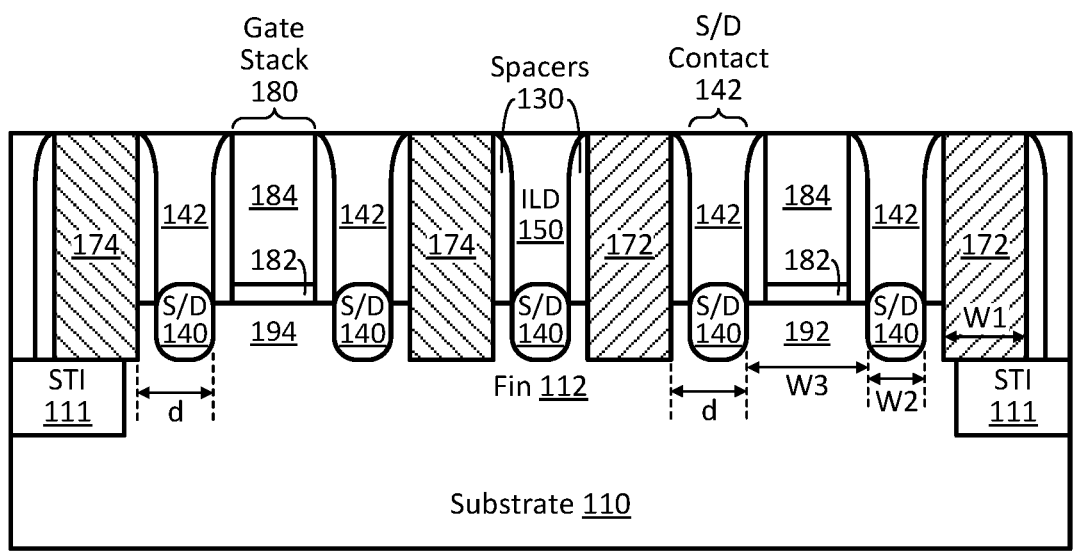

FIG. 1F illustrates an example structure after the dummy gate stacks 120 in the structure of FIG. 1E were removed and replaced with gate stacks 180 including gate dielectric material 182 and gate electrode material 184, in accordance with an embodiment. The processing also included removing ILD material 150 above S/D regions 140 on either side of channel regions 192 and 194, and replacing the ILD material 150 with S/D contact material 142. In some embodiments, ILD material 150 may be removed using any suitable techniques, including any suitable wet and/or dry etch processes, for example. In some embodiments, S/D contacts 142 may be formed using any suitable techniques, such as using any suitable deposition processes (e.g., CVD, ALD, or PVD). In some embodiments, S/D contacts 142 may include any suitable material, such as a conductive metal or alloy (e.g., aluminum, tungsten, silver, nickel-platinum, or nickel-aluminum). In some embodiments, S/D contacts 142 may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the S/D contacts region 142, such as adhesion layers (e.g., titanium nitride) and/or liner or barrier layers (e.g., tantalum nitride), if so desired. In some embodiments, metallization of the S/D contacts 142 may be carried out, for example, using a silicidation or germanidation process (e.g., generally, deposition of contact metal followed by annealing). Note that, in some embodiment, gate stacks 180 may be formed prior to the formation of S/D contacts 142, while in other embodiments, gate stacks 180 may be formed after the formation of S/D contacts 142, for example. Additional processing may be performed to complete the formation of one or more transistor devices, such as performing back-end-of line interconnections, for example.

In some embodiments, gate stacks 180, including gate dielectric material 182 and gate electrode material 184 (in this example embodiment), may be formed using any suitable techniques, such as using replacement metal gate (RMG) processing, for example. In some embodiments, gate dielectric material 182 may be conformally deposited, such that the material is located on the side walls of the gate stack region 180 and on spacers 130, as opposed to what is shown in the structure of FIG. 1F. In some embodiments, gate dielectric material 182 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 182 to improve its quality when a high-k material is used, for example. In some embodiments, additional processing may include the formation of gate contacts in contact with the gate electrode 184. In some embodiments, the material of gate electrode 184 or gate contacts (where present) may include any suitable material, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, one or more material layers may be formed between the gate dielectric 182 and gate 184 to, for example, increase the interface quality between the gate dielectric 182 and the gate 184 and/or to improve the electrical properties between the gate dielectric 182 and the gate 184. Such intervening layers may include one or more work-function material layers, for example. In some embodiments, gate dielectric layer 182 and/or gate 184 may include a multi-layer structure of two or more material layers. In some embodiments, gate dielectric layer 182 and/or gate 184 may include grading (e.g., increasing and/or decreasing) the content of one or more materials in at least a portion of the layer. Note that, in this example embodiment, the transistor channel regions 192 and 194 may be defined by their corresponding gate stacks 180 and/or the channel regions 192 and 194 may be defined by their adjacent corresponding S/D regions 140, for example.

In some embodiments, thermal boost material 172 may be selected to include materials having a high positive linear coefficient of thermal expansion (CTE) or a negative linear CTE, depending on the end use or target application. In embodiments where the thermal boost material 172 includes a material having a high positive linear CTE value, such high positive linear CTE values may be greater than 4, 5, 6, 7, 8, 9, 10, 15, or 20 ppm/° C. (e.g., at around 20° C., where around 20° C. includes plus or minus 5° C. from 20° C. or 15-25° C.), or some other suitable floor value, depending on the end use or target application. For example, some such suitable materials may include aluminum oxide (or alumina), aluminum nitride, porous oxide, sapphire, and/or beryllium oxide (or beryllia), to name some examples. In some embodiments, thermal boost material 172 including a high positive linear CTE may be used in a PMOS device to improve performance of the device at high operating temperatures (e.g., temperatures greater than 40, 50, 60, 70, 80, 90, 100, 125, 150, 175, or 200° C.) and/or high operating gate voltages (e.g., voltages greater than 1.5, 1.8, 2.5, 3.3, or 5 V). In such embodiments, the performance improvement may be derived from the compressive strain induced in the channel region 192 when the material having a high positive linear CTE expands as operating temperature increases. Accordingly, in some embodiments, the thermal boost material can improve carrier mobility (e.g., hole mobility, in the case of PMOS) and compensate for temperature induced mobility degradation, for example. In some embodiments, the high positive linear CTE material may improve TFET performance, such as by causing strain on one or both of the S/D regions 140 to, for example, modify the band diagram where the tunneling occurs.

In some embodiments, thermal boost material 172 may be selected to include materials having a negative linear CTE value, which can also be expressed as a linear CTE value less than 0 ppm/° C. (e.g., at around 20° C.). For example, some such suitable materials may include hafnium tungstate, hafnium molybdate, zirconium tungstate (or cubic zirconium tungstate), zirconium molybdate, and/or zirconium vanadate, to name some examples. In some embodiments, thermal boost material 172 include a negative linear CTE may be used in an NMOS device to improve performance of the device at high operating temperatures (e.g., temperatures greater than 40, 50, 60, 70, 80, 90, 100, 125, 150, 175, or 200° C.) and/or high operating gate voltages (e.g., voltages greater than 1.5, 1.8, 2.5, 3.3, or 5 V). In such embodiments, the performance improvement may be derived from the tensile strain induced in the channel region 192 when the material having a negative linear CTE contracts as operating temperature increases. Accordingly, in some embodiments, the thermal boost material can improve carrier mobility (e.g., electrons, in the case of NMOS) and compensate for temperature induced mobility degradation, for example. In some embodiments, the negative linear CTE material may improve TFET performance, such as causing strain on one or both of the S/D regions 140 to, for example, modify the band diagram where the tunneling occurs. In other words, the thermal boost material described herein may derive its thermal boost properties as a result of the target transistor configuration it is adjacent to, such that its expansion or contraction (caused as the operating temperature increases) positively affects that adjacent transistor, such as by increasing carrier mobility in the channel region of that adjacent transistor due to the strain caused by the thermal boost material expansion or contraction.

In some embodiments, the thermal boost material 172 adjacent to the transistor device may isolate the transistor device from surrounding integrated circuit devices. For example, the thermal boost material 172, that is located in trenches formed from removing dummy gate stacks and etching into the fin material (or replacement fin material or substrate material, depending on the integrated circuit configuration), may provide electrical isolation along the fin direction or along the direction of the channel carrier movement (e.g., along the source to drain direction). For instance, in FIG. 1F, material 172 may provide electrical isolation between the S/D region 140 on the left side of channel region 192 and the S/D region 140 on the right side of channel region 194, and so forth. In the example structure of FIG. 1F, channel region 192 includes thermal boost material 172 adjacent to the S/D regions 140 on either side of that channel region 192, as shown. Further, the example structure of FIG. 1F also includes channel region 194, which includes material 174 adjacent to the S/D regions 140 on either side of that channel region 194. In some embodiments, material 174 may include a thermal boost material, including any suitable material described above with reference to thermal boost material 172. For example, if the right gate stack 180 and corresponding channel region 192 is intended to be used in a PMOS device, then material 172 may include thermal boost material having a high positive linear CTE (e.g., CTE value greater than 5 ppm/° C. at around 20° C.), and if the left gate stack 180 and corresponding channel region 194 is intended to be used in an NMOS device, then material 174 may include thermal boost material having a negative linear CTE (e.g., CTE value less than 0 ppm/° C. at around 20° C.). Further, in such an example embodiment, the PMOS and NMOS device may be used in a CMOS device, where one of or both of the PMOS and NMOS components benefit from the thermal boost techniques described herein.

In some embodiments, material 174 may be standard isolation material, including isolation material having a linear CTE value between 0 and 4 ppm/° C. (e.g., at around 20° C.), such as silicon nitride or silicon carbide. Therefore, in some embodiments, transistors including adjoining thermal boost material (e.g., material 172) as described herein may be used with transistors that include adjoining material that is standard isolation material, depending on the end use or target application. Note that although there are two replacement stacks between the gate stacks 180 of the structure of FIG. 1F (e.g., a stack of material 172 and material 174, from right to left), in some embodiments, any number of material stacks may be located between transistor devices, such as 1, 3, 4, or 5, or any other suitable number. In some embodiments, material 172 and 174 is adjacent to S/D regions 140 on either side of channel regions 192 and 194, respectively. As previously described, in some embodiments, one or more features or materials may be located between material regions 172 or 174 and their corresponding adjacent S/D region 140. For example, in the structure of FIG. 1F, fin material 112 is located between material 172/174 and respective S/D region material 140 in a lower portion, and spacer material 130 is located between material 172/174 and respective S/D region material 140 in an upper portion.

In some embodiments, the location of thermal boost material (or isolation material) 172 or 174 may be defined by a relative distance from a transistor feature. For example, as illustrated in FIG. 1F, the distance d shown is the distance between material 172/174 and the respective channel region 192/194. In some embodiments, distance d may be less than 10, 20, 50, 100, 150, 200, 250, 300, 400, or 500 nm, or some other suitable maximum distance, depending on the end use or target application. In some embodiments, the relative distance used to define material 172 or 174 may be the distance between that material and the adjacent S/D region material 140. In some such embodiments, such a distance may be less than 5, 10, 20, 50, 100, 150, 200, 250, or 300 nm, or some other suitable maximum distance, depending on the end use or target application. In some embodiments, the distance of thermal boost material relative to a transistor and its features (and/or the linear CTE value of the thermal boost material) may be selected based on the desired effect of using the thermal boost material. In other words, the integrated circuit configuration including thermal boost material used may be adjusted to an end use or target application. For example, in some embodiments, thermal boost material as described herein may be formed closer to the adjacent transistor it will be affecting to increase the thermal enhancement obtained at high operating temperatures (e.g., operating temperatures greater than 50° C.). In some embodiments, the location of material 172 or 174 may be defined by stating that the nearest S/D region 140 is between that material 172 or 174 and the transistor channel region 192 or 194. For example, looking at the structure of FIG. 1F, it can be seen that the right-most S/D region 140 is located between the right-most thermal boost material 172 and channel region 192.

In some embodiments, the width W1 of thermal boost material feature 172 may be in the range of 10 nm to 1 micron (e.g., in the range of 50-500 nm), or some other suitable size, depending on the end use or target application. In some embodiments, the width W1 of thermal boost material feature 172 may be defined relative to the width W2 of an adjacent S/D region 140 or the width W3 of an adjacent channel region 192, for example. For instance, in some embodiments, the ratio of the width W1 of a thermal boost material feature (adjacent to a transistor) to the width W2 of an adjacent S/D region of that transistor may include ratios (W1:W2) of: approximately 1:1; at least 1:2, 1:3, 1:4, or 1:5; at least 2:1, 3:1, 4:1, or 5:1; or some other suitable ratio, as will be apparent in light of this disclosure. In some embodiment, the ratio of the width W1 of a thermal boost material feature (adjacent to a transistor) to the width W3 of the adjacent transistor channel region may include ratios (W1: W2) of: approximately 1:1, at least 1:2, 1:3, 1:4, or 1:5; at least 2:1, 3:1, 4:1, or 5:1; or some other suitable ratio, as will be apparent in light of this disclosure.

As previously described, although the techniques described with reference to FIGS. 1A-F are primarily described and depicted in the context of an integrated circuit including transistors having a finned configuration (e.g., finFET or tri-gate configurations), the techniques can be applied to integrated circuits including transistors having planar configurations or transistors having other non-planar configurations, such as a dual-gate configuration or a gate-all-around (GAA) configuration (e.g., including one or more nanowires or nanoribbons). Further, the techniques can be applied to benefit transistors having channel regions including various semiconductor material, such as group IV material (e.g., Si, Ge, SiGe, SiC) and/or group III-V material (e.g., GaAs, InGaAs, GaN, InGaN), to name some examples. Further still, the transistor channel material may be native to the substrate material, the transistor channel may include replacement material (e.g., in the case of replacement fins or nanowires made from replacement material), or the transistor channel may include some combination of native and replacement material (e.g., a base portion of an active fin includes native substrate material while an upper portion includes replacement material). Note that, regardless of whether the transistor channel includes material native to the substrate material, it may or may not also include one or more dopant materials, depending on the end use or target application. For example, in the case of a MOSFET configuration, the channel region may be doped in a type opposite from the adjacent S/D regions, such as an NMOS configuration that includes n-type doped S/D material and p-type doped channel material, or a PMOS configuration that includes p-type doped S/D material and n-type doped channel material. In the case of a TFET configuration, the S/D regions may be oppositely typed doped (where one is n-type doped and the other is p-type doped) and the channel material may be minimally doped or undoped/intrinsic. Accordingly, the techniques described herein are not intended to be limited to any particular transistor configuration, unless otherwise stated. Also note that, although the integrated circuit structure of FIG. 1F shows the two transistors (one transistor having channel region 192 and the other having channel region 194) as neighboring devices for ease of illustrations, that need not be the case. For example, in some embodiments, such transistors may be located anywhere on a single chip or die, such that the two transistors may be located any distance apart on the same substrate or integrated circuit. Numerous variations and configurations will be apparent in light of the present disclosure, and some such variations will be described herein with reference to FIGS. 2A-F below.

FIGS. 2A-F illustrate numerous structural variations made to approximately the right half of the example integrated circuit structure of FIG. 1F, in accordance with some embodiments. Note that the S/D region 140 in the middle of the structure of FIG. 1F has been left out of the structures in FIGS. 2A-F, for ease of illustration. Moreover, that middle S/D region 140 from the structure of FIG. 1F is not used in a transistor device. The previous relevant discussion with respect to the features of FIG. 1F that are similar in FIGS. 2A-F applies equally to those features, such as the previous relevant discussion with respect substrate 110, STI 111, fin 112, spacers 130, S/D regions 140, S/D contacts 142, and channel region 192, for example. Note that in FIGS. 2A-F, the structure includes arrows inside of thermal boost material features are used to indicate expansion (arrows facing away from the center of the material feature) or contraction (arrows facing toward the center of the material feature) as operating temperature T increases, which is indicated via arrows pointing upward above temperature T outside of the structures of FIGS. 2A-F. Such arrow indications are provided for illustrative purposes and are not intended to be a part of the real-world structures formed. Generally, with reference to FIGS. 2A-F, when thermal boost material 272 is being used, it is a material having a high positive linear CTE (e.g., CTE value greater than 5 ppm/° C. at around 20° C.), and when thermal boost material 372 is being used, it is a material having a negative linear CTE (e.g., CTE less than 0 ppm/° C. at around 20° C.). The indicators of 272 and 372 for the material features are being used as they correspond to general thermal boost material 172 in FIGS. 1D-F.

Figure 2A:
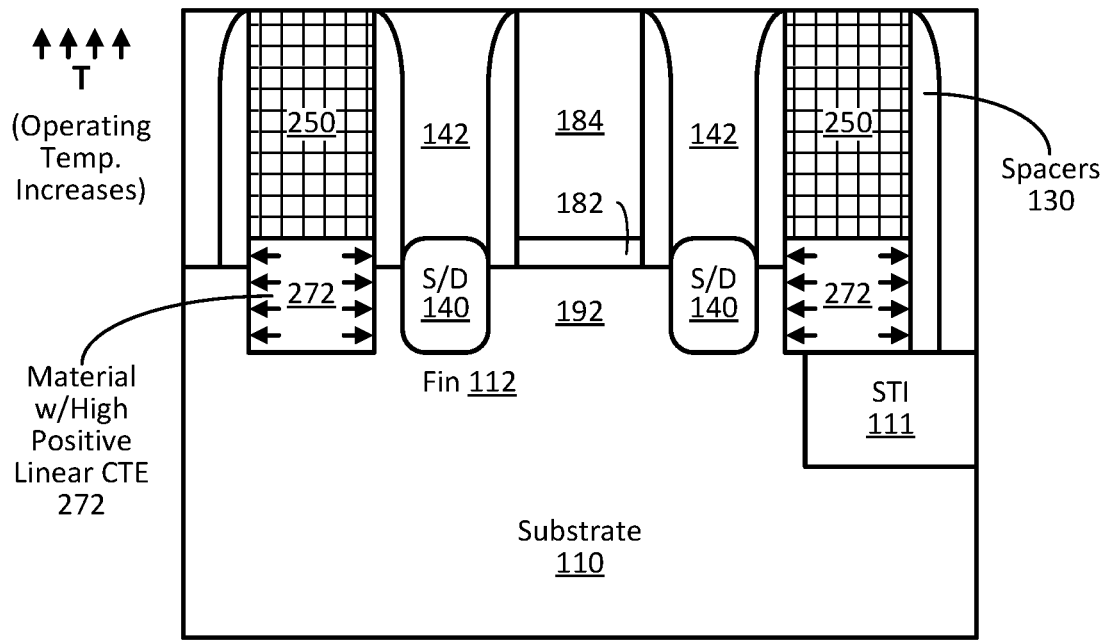
FIGS. 2A-F illustrate numerous structural variations made to approximately the right half of the example integrated circuit structure of FIG. 1F, in accordance with some embodiments of this disclosure.
Figure 2B:
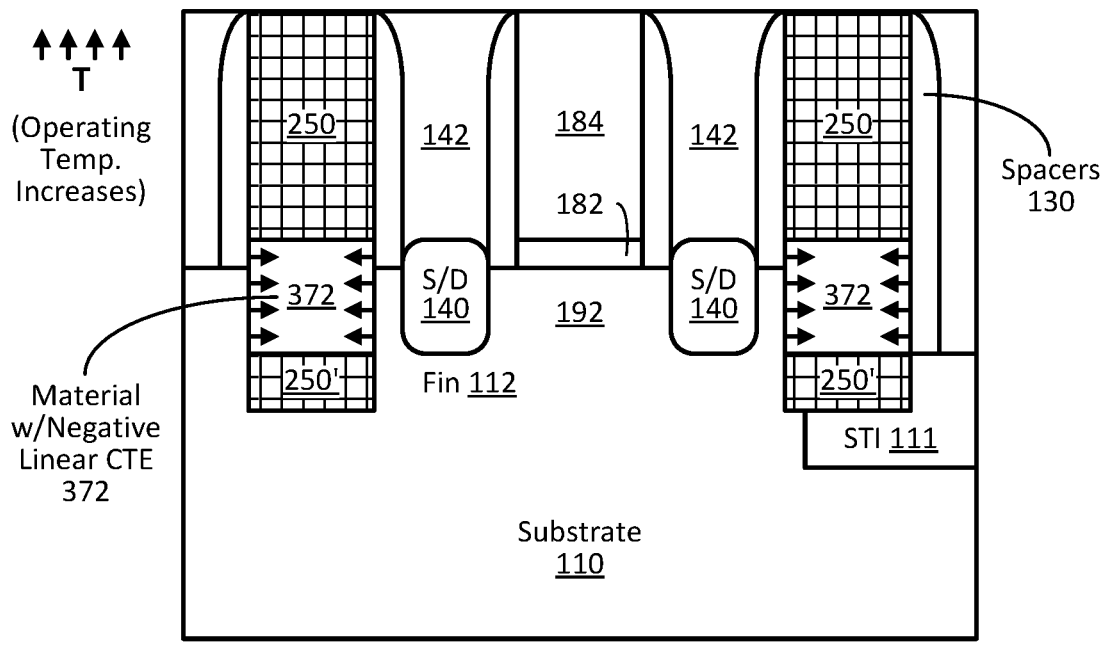

FIGS. 2A and 2B are provided to illustrate that in some embodiments, one or more materials in addition to thermal boost material 272 or 372 may be included in the etched regions 160 formed in FIG. 1B. For example, in FIGS. 2A and 2B, additional material 250 is above thermal boost material 272 and 372 in the fin trench isolation region (which extends in a perpendicular direction relative to fin 112). In addition, in FIG. 2B, additional material 250' is below thermal boost material 372, where additional material 250' may be the same as or different from material 250. In some embodiments, material 250/250' may include a hardmask material that may protect thermal boost material 272 during subsequent processing, such as spin-on carbon (SOC), titanium oxide, tungsten oxide, or zirconium oxide, to name some examples. In some embodiments, material 250/250' may be selected to be a more rigid material to help control the directionality of expansion or contraction of thermal boost material 272 or 372, such as various ceramic materials including high stiffness properties. In this manner, thermal boost material may be more likely to expand or contract in a direction substantially parallel with channel region 192 and thereby cause a greater strain effect on the channel region 192. Note that thermal boost material 272 and 372 is adjacent to both S/D regions 140 (and thus channel region 192 is between the thermal boost material). Also note that the thermal boost material features have a height that is the same as and aligned with the height of the adjacent S/D region 140 in the example structures of FIGS. 2A and 2B; however, the present disclosure is not intended to be so limited.

Figure 2C:
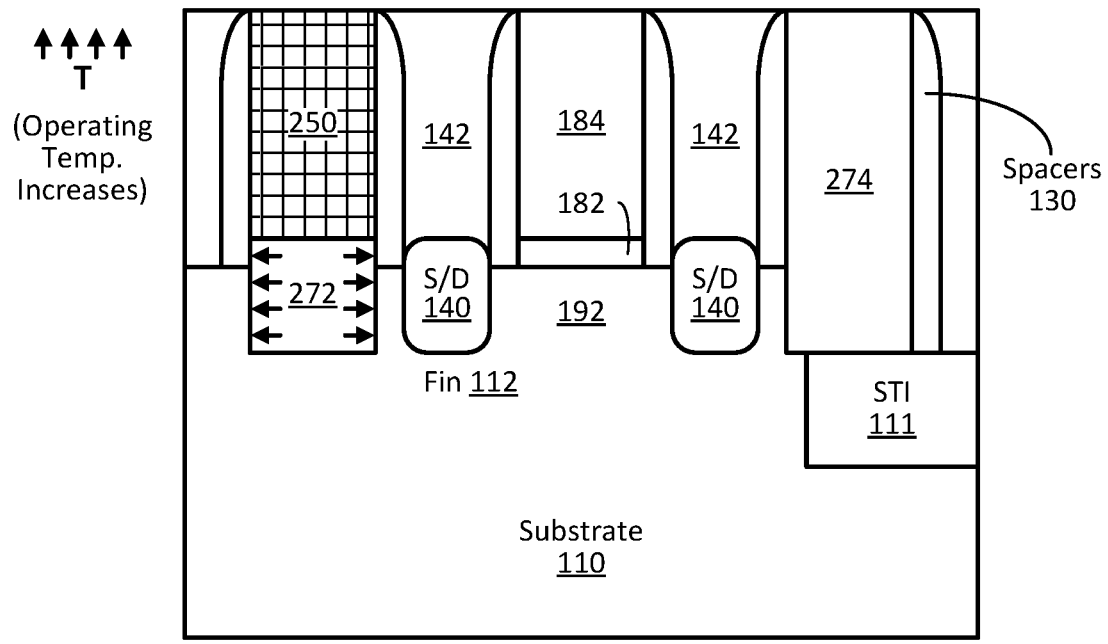

FIG. 2C is provided to illustrate that in some embodiments, thermal boost material may be adjacent to only one side of a transistor. For example, as can be seen, the structure of FIG. 2C is the same as the structure of FIG. 2A, except that only the left side of the transistor including channel region 192 includes thermal boost material (specifically, material 272 in this example case). As can also be seen in this example embodiment, the right side fin trench isolation region includes material 274 instead of materials 272 and 250. In some embodiments, material 274 may be a standard isolation material having a linear CTE value between 0 and 4 ppm/° C. (e.g., at around 20° C.), such as silicon nitride or silicon carbide, for example. Note that in this example structure, the strain caused to the channel region 192 may be uneven due to the thermal boost material only being adjacent to one side of the transistor, for example.

Figure 2D:
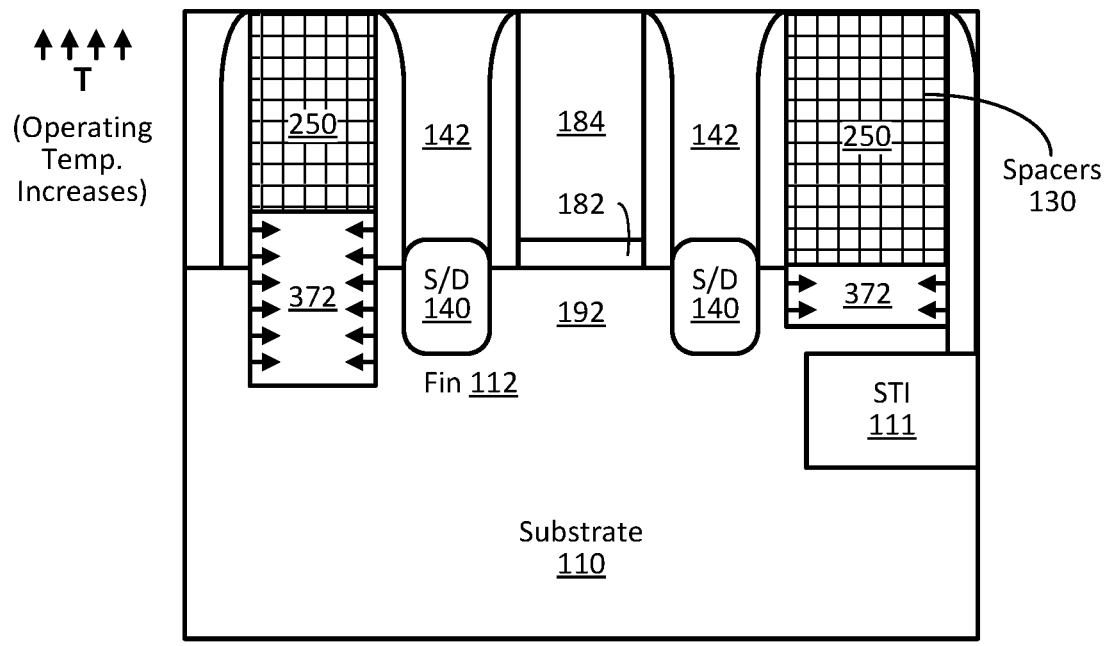

FIG. 2D is provided to illustrate that in some embodiments, thermal boost material features need not be exactly aligned to the S/D or channel regions of adjacent transistors. For example, as can be seen in FIG. 2D, the left side thermal boost material feature 372 extends above and below adjacent S/D region 140 and channel region 192. In some embodiments, such a configuration may be desired to ensure that the thermal boost material is at least aligned with the height of adjacent transistor S/D region and/or channel region, for example. In some embodiments, the thermal boost material feature may extend only one of above or below the adjacent S/D region 140 and/or channel region 192. As can also be seen in FIG. 2D, the right side thermal boost material feature 372 is smaller than the adjacent S/D region 140 and channel region 192. FIG. 2D is also provided to illustrate that in some embodiments, the thermal boost material features may have varying widths, such as the horizontally wider thermal boost material feature 372 on the right side of channel region 192 compared to the thermal boost material feature 372 on the left side of channel region 192. In FIG. 2D, any and/or all of the variations in the thermal boost material features on either side of the transistor including channel region 192 may affect the strain caused in that region by the thermal boost material as the operating temperature increases. For example, the right side thermal boost material feature 372 may not cause as much strain in channel region 192 as the left side thermal boost material feature 372 (e.g., due to the right side feature being vertically shorter and/or horizontally wider).

Figure 2E:
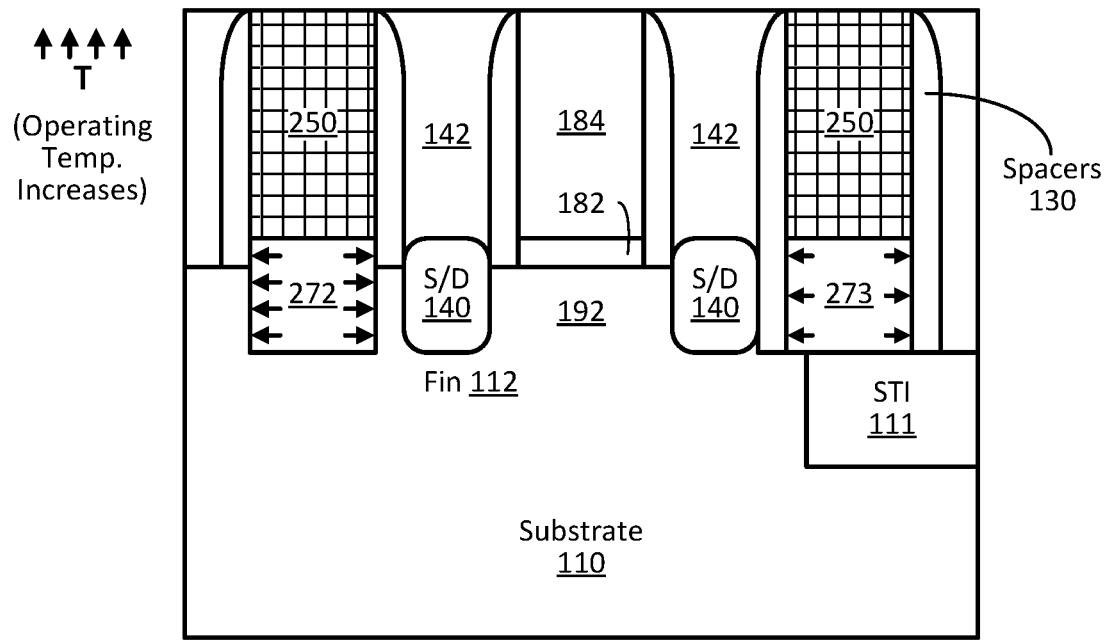

FIG. 2E is provided to illustrate that in some embodiments, the thermal boost material adjacent to either side of a transistor may not be the same material. For example, as can be seen, the left side of the structure is the same as that of the structure of FIG. 2A, with thermal boost material 272 adjacent to the S/D region 140 on the left side of channel region 192. As can also be seen, the right side of the structure includes a different thermal boost material 273 that, in this example embodiment, still has a positive linear CTE, but has a lower positive linear CTE value than thermal boost material 272 (indicated with smaller and less arrows). For instance, in some embodiments, the difference in the absolute value of the two thermal boost materials may be at least 1, 2, 3, 4, or 5 ppm/° C. (e.g., at around 20° C.), or some other minimum value, depending on the end use or target application. In some embodiments, a material having a high positive linear CTE (e.g., CTE value greater than 5 ppm/° C. at around 20° C.) may be adjacent to one side of a transistor, while a material having a negative linear CTE (e.g., CTE value less than 0 ppm/° C. at around 20° C.) may be adjacent to the other side of the transistor. In any such example structures, the differences in the thermal boost materials used on either side of a transistor may result in uneven strain in the transistor channel region 192, for example.

Figure 2F:
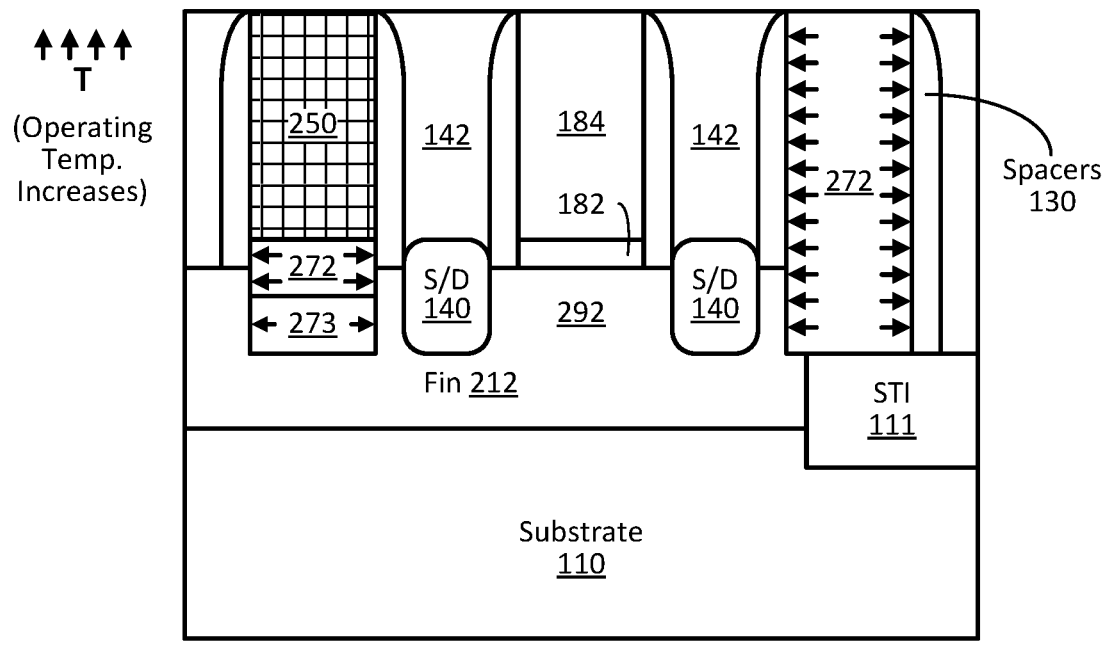

FIG. 2F is provided to illustrate that in some embodiments, more than one thermal boost material may be on one side of and adjacent to a transistor. As can be seen in FIG. 2F, the structure includes two different thermal boost materials 272 and 273 adjacent to the left side of the transistor. The previous relevant discussion with respect to material 273 is equally applicable here. For instance, as can be seen in this example structure, 273 includes a high positive linear CTE value, but a value that is less than the CTE value of material 272 (indicated with smaller and less arrows). In some embodiments, thermal boost material features may be multi-layer features including at least one thermal boost material described herein. In some embodiments, thermal boost material features may include grading (e.g., decreasing and/or increasing) the content of one or more materials throughout the feature. In the example embodiment of FIG. 2F, material layers 272 and 273 on the left side of transistor channel region 192 may be considered either two discrete thermal boost material features or one thermal boost material feature including two different layers. In any such case, the channel region may include uneven strain as a result of such variations. For instance, in this example embodiment, the strain may be greater at the top of the channel region 192 (located closest to the gate dielectric 182 as shown), due to material 272 having a higher linear CTE value than material 273. As can be understood, the opposite would be true in the case of materials having negative linear CTE values, such that a more negative value may have a greater influence, for example. FIG. 2F also shows the right side of the structure being similar to that in FIG. 1F, where the thermal boost material 272 occupies the entirety of the etched region 160 formed in FIG. 1B. FIG. 2F also shows that fin 212, in this example embodiment, was formed from replacement material that is not native to the material of substrate 110. Accordingly, in this example embodiment, transistor channel region material 292 includes the same material of replacement fin 212 (whether such region 292 is doped or undoped) and is thus not native to substrate material 110. Numerous variations and configurations will be apparent in light of the present disclosure.

Example System

Figure 3:
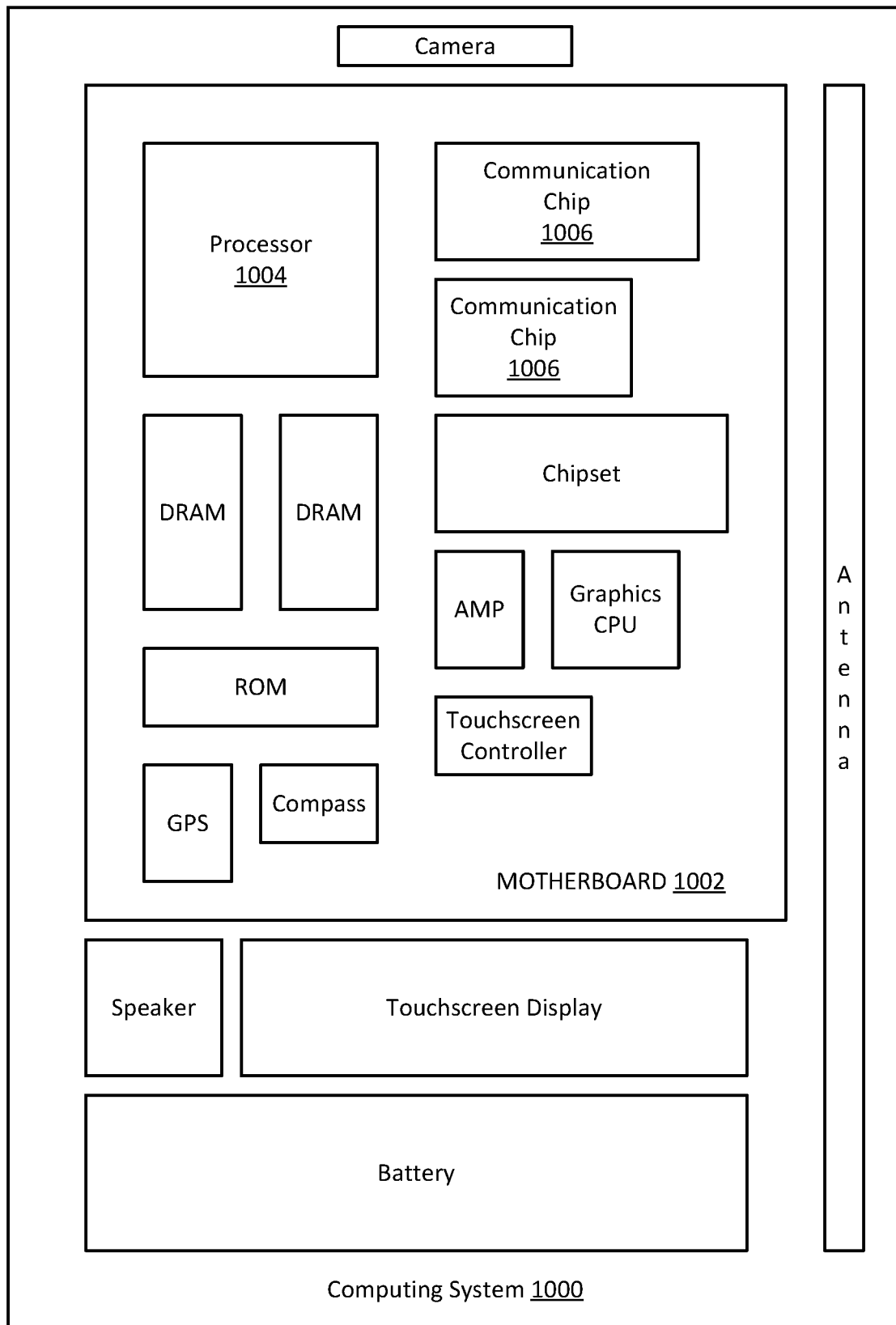
FIG. 3 illustrates a computing system implemented with integrated circuit structures or devices formed using the techniques disclosed herein, in accordance with some embodiments.

FIG. 3 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a transistor having a channel region, a gate stack above the channel region and source and drain (S/D) regions adjacent to the channel region; and also including a first material adjacent to one of the S/D regions, wherein the S/D region that is adjacent to the first material is between the first material and the channel region, and wherein the first material has a linear coefficient of thermal expansion (CTE) value that is one of greater than 5 ppm/° C. and less than 0 ppm/° C. at around 20° C.

Example 2 includes the subject matter of Example 1, wherein the first material has a linear CTE value that is greater than 5 ppm/° C. at around 20° C.

Example 3 includes the subject matter of any of Examples 1-2, wherein the first material includes one of aluminum oxide, aluminum nitride, beryllium oxide, porous oxide, and sapphire.

Example 4 includes the subject matter of any of Examples 1-3, wherein the transistor is a p-type metal-oxide-semiconductor field-effect transistor.

Example 5 includes the subject matter of Example 1, wherein the first material has a linear CTE value that is less than 0 ppm/° C. at around 20° C.

Example 6 includes the subject matter of any of Examples 1 or 5, wherein the first material includes one of hafnium tungstate, hafnium molybdate, zirconium tungstate, zirconium molybdate, and zirconium vanadate.

Example 7 includes the subject matter of any of Examples 1 or 5-6, wherein the transistor is an n-type metal-oxide-semiconductor field-effect transistor.

Example 8 includes the subject matter of any of Examples 1-7, wherein the first material is directly adjacent to the one of the S/D regions, such that the first material is in contact with that S/D region.

Example 9 includes the subject matter of any of Examples 1-7, wherein another material is between the first material and the one of the S/D regions, the other material different than the first material.

Example 10 includes the subject matter of any of Examples 1-9, wherein the first material is adjacent to both of the S/D regions, such that each of the S/D regions is between the first material and the channel region.

Example 11 includes the subject matter of any of Examples 1-10, further including hardmask material on the first material.

Example 12 includes the subject matter of any of Examples 1-11, wherein a second material is adjacent to the other of the S/D regions, such that the other of the S/D regions is between the second material and the channel region, the second material having a linear CTE value different than the linear CTE value of the first material.

Example 13 includes the subject matter of any of Examples 1-12, further including: another transistor having a channel region, a gate stack above the channel region, and S/D regions adjacent to the channel region; and also including a second material adjacent to one of the S/D regions of the other transistor, wherein the S/D region that is adjacent to the second material is between the second material and the channel region of the other transistor and wherein the second material has a linear CTE value that is between 0 ppm/° C. and 5 ppm/° C. at around 20° C.

Example 14 includes the subject matter of Example 13, wherein the second material is one of silicon nitride and silicon carbide.

Example 15 includes the subject matter of any of Examples 13-14, wherein the linear CTE value of the first material is at least 2 ppm/° C. at around 20° C. greater than the linear CTE value of the second material.

Example 16 includes the subject matter of any of Examples 1-15, wherein the transistor includes at least one of the following configurations: planar, non-planar, dual-gate, finned, tri-gate, finned field-effect transistor (finFET), nanowire, nanoribbon, gate-all-around, metal-oxide-semiconductor FET (MOSFET), and tunnel FET (TFET).

Example 17 is a computing system including the subject matter of any of Examples 1-16.

Example 18 is an integrated circuit including: a transistor having a channel region, a gate stack above the channel region, and source and drain (S/D) regions adjacent to the channel region, each of the S/D regions having a corresponding vertical height; and also including a first material adjacent to the entirety of the height of each of the S/D regions, wherein each of the S/D regions are between the first material and the channel region, and wherein the first material has a linear coefficient of thermal expansion (CTE) value that is one of greater than 5 ppm/° C. and less than 0 ppm/° C. at around 20° C.

Example 19 includes the subject matter of Example 18, wherein the first material has a linear CTE value that is greater than 5 ppm/° C. at around 20° C.

Example 20 includes the subject matter of any of Examples 18-19, wherein the first material includes one of aluminum oxide, aluminum nitride, beryllium oxide, porous oxide, and sapphire.

Example 21 includes the subject matter of any of Examples 18-20, wherein the transistor is a p-type metal-oxide-semiconductor field-effect transistor.

Example 22 includes the subject matter of Example 18, wherein the first material has a linear CTE value that is less than 0 ppm/° C. at around 20° C.

Example 23 includes the subject matter of any of Examples 18 or 22, wherein the first material includes one of hafnium tungstate, hafnium molybdate, zirconium tungstate, zirconium molybdate, and zirconium vanadate.

Example 24 includes the subject matter of any of Examples 18 or 22-23, wherein the transistor is an n-type metal-oxide-semiconductor field-effect transistor.

Example 25 includes the subject matter of any of Examples 18-24, wherein the first material is directly adjacent to the S/D regions, such that the first material is in contact with each S/D region.

Example 26 includes the subject matter of any of Examples 18-24, wherein another material is between the first material and the S/D regions, the other material different than the first material.

Example 27 includes the subject matter of any of Examples 18-26, further including hardmask material on the first material.

Example 28 includes the subject matter of any of Examples 18-27, wherein the first material extends at least one of below and above the height of the corresponding adjacent S/D region.

Example 29 includes the subject matter of any of Examples 18-28, further including: another transistor having a channel region, a gate stack above the channel region, and S/D regions adjacent to the channel region; and also including a second material adjacent to one of the S/D regions of the other transistor, wherein the S/D region that is adjacent to the second material is between the second material and the channel region of the other transistor and wherein the second material has a linear CTE value that is between 0 ppm/° C. and 5 ppm/° C. at around 20° C.

Example 30 includes the subject matter of Example 29, wherein the second material is one of silicon nitride and silicon carbide.

Example 31 includes the subject matter of any of Examples 29-30, wherein the linear CTE value of the first material is at least 2 ppm/° C. at around 20° C. greater than the linear CTE value of the second material.

Example 32 includes the subject matter of any of Examples 18-31, wherein the transistor includes at least one of the following configurations: planar, non-planar, dual-gate, finned, tri-gate, finned field-effect transistor (finFET), nanowire, nanoribbon, gate-all-around, metal-oxide-semiconductor FET (MOSFET), and tunnel FET (TFET).

Example 33 is a computing system including the integrated circuit of any of Examples 18-32.

Example 34 is a method of forming an integrated circuit, the method including: forming a plurality of dummy gate stacks above a substrate, wherein a first dummy gate stack is adjacent to a second dummy gate stack; removing dummy gate material from the first dummy gate stack to form a first trench; depositing a first material in at least a portion of the first trench, wherein the first material has a linear coefficient of thermal expansion (CTE) value that is one of greater than 5 ppm/° C. and less than 0 ppm/° C. at around 20° C.; removing dummy gate material from the second dummy gate stack to form a second trench; and depositing gate dielectric and gate electrode material in the second trench, wherein the gate dielectric and gate electrode material define a transistor channel region.

Example 35 includes the subject matter of Example 34, wherein the first material has a linear CTE value that is greater than 5 ppm/° C. at around 20° C.

Example 36 includes the subject matter of any of Examples 34-35, wherein the first material includes one of aluminum oxide, aluminum nitride, beryllium oxide, porous oxide, and sapphire.

Example 37 includes the subject matter of any of Examples 34-36, wherein the transistor is a p-type metal-oxide-semiconductor field-effect transistor.

Example 38 includes the subject matter of Example 34, wherein the first material has a linear CTE value that is less than 0 ppm/° C. at around 20° C.

Example 39 includes the subject matter of any of Examples 34 or 38, wherein the first material includes one of hafnium tungstate, hafnium molybdate, zirconium tungstate, zirconium molybdate, and zirconium vanadate.

Example 40 includes the subject matter of any of Examples 34 or 38-39, wherein the transistor is an n-type metal-oxide-semiconductor field-effect transistor.

Example 41 includes the subject matter of any of Examples 34-40, further including depositing a hardmask material in the first trench and above the first material.

Example 42 includes the subject matter of any of Examples 34-41, further including: depositing sacrificial material in the first trench; and removing the sacrificial material from the first trench prior to depositing the first material.

Example 43 includes the subject matter of Example 42, wherein the sacrificial material is carbon hardmask material.

Example 44 includes the subject matter of any of Examples 34-42, further including: removing dummy gate material from a third dummy gate stack to form a third trench; and depositing a second material in at least a portion of the third trench, wherein the second material has a linear CTE value that is between 0 ppm/° C. and 5 ppm/° C. at around 20° C.

Example 45 includes the subject matter of Example 44, wherein the second material is one of silicon nitride and silicon carbide.

Example 46 includes the subject matter of any of Examples 44-45, wherein the linear CTE value of the first material is at least 2 ppm/° C. at around 20° C. greater than the linear CTE value of the second material.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including a finFET transistor, the integrated circuit comprising:
   a fin including a first material comprising semiconductor material;
   a gate structure above the fin and adjacent sidewalls of the fin, the gate structure including a gate electrode and a gate dielectric, the gate dielectric between the gate electrode and the fin;
   a source region and a drain region, the fin at least partially between the source and drain regions, the source and drain regions including a second material comprising semiconductor material; and
   a third material distinct from the first and second materials, the third material adjacent to at least one of the source or drain regions, the at least one of the source or drain regions between the third material and the fin, wherein the third material has a linear coefficient of thermal expansion (CTE) value that is either greater than 5 parts per million per degree Celsius (ppm/° C.) at around 20° C. or less than 0 ppm/° C. at around 20° C.

2. The integrated circuit of claim 1, wherein the third material has a linear CTE value that is greater than 5 ppm/° C. at around 20° C.

3. The integrated circuit of claim 2, wherein the third material includes at least one of aluminum oxide, aluminum nitride, beryllium oxide, a porous oxide, or sapphire.

4. The integrated circuit of claim 2, wherein the finFET transistor is a p-type metal-oxide-semiconductor field-effect transistor.

5. The integrated circuit of claim 1, wherein the third material has a linear CTE value that is less than 0 ppm/° C. at around 20° C. and the finFET transistor is an n-type metal-oxide-semiconductor field-effect transistor.

6. The integrated circuit of claim 5, wherein the third material includes at least one of hafnium tungstate, hafnium molybdate, zirconium tungstate, zirconium molybdate, or zirconium vanadate.

7. The integrated circuit of claim 1, wherein the third material is in direct contact with the at least one of the source or drain regions.

8. The integrated circuit of claim 1, further comprising additional material between the third material and the at least one of the source or drain regions, the additional material compositionally different from the third material.

9. The integrated circuit of claim 1, further comprising hardmask material on and above the third material and wherein the third material is adjacent to both of the source and drain regions.

10. The integrated circuit of claim 1, wherein the third material is adjacent to only one of the source or drain regions, and a fourth material is adjacent to the other of the source or drain regions, such that the other of the source or drain regions is between the fourth material and the fin, the fourth material having a linear CTE value different from the linear CTE value of the third material.

11. The integrated circuit of claim 1, further comprising another finFET transistor adjacent to the finFET transistor; and
   a fifth material adjacent to the other finFET transistor, wherein the fifth material has a linear CTE value that is between 0 ppm/° C. and 5 ppm/° C. at around 20° C.

12. The integrated circuit of claim 11, wherein the fifth material is silicon nitride or silicon carbide.

13. The integrated circuit of claim 11, wherein the linear CTE value of the third material is at least 2 ppm/° C. at around 20° C. greater than the linear CTE value of the fifth material.

14. A computing system comprising the integrated circuit of claim 1.

15. An integrated circuit comprising:
   a body including semiconductor material
   a gate structure at least above the body, the gate structure including a gate electrode and a gate dielectric, the gate dielectric between the gate electrode and the body, and
   a source region and a drain region, the body at least partially between the source and drain regions, the source and drain regions including semiconductor material and having a corresponding vertical height;
   a first structure including a first material, the first structure adjacent to the entirety of the vertical height of the source region, the source region between the first structure and the body, a first layer of a second material between the first structure and the source region, the second material compositionally different from the first material;
   a second structure including the first material, the second structure adjacent to the entirety of the vertical height of the drain region, the drain region between the second structure and the body, a second layer of the second material between the second structure and the drain region; and
   wherein the first material included in the first and second structures has a linear coefficient of thermal expansion (CTE) value that is either greater than 5 parts per million per degree Celsius (ppm/° C.) at around 20° C. or less than 0 ppm/° C. at around 20° C.

16. The integrated circuit of claim 15, wherein the first material included in the first and second structures has a linear CTE value that is greater than 5 ppm/° C. at around 20° C.

17. The integrated circuit of claim 15, wherein the first structure extends at least one of below or above the entirety of the vertical height of the source region, and the second structure extends at least one of below or above the entirety of the vertical height of the drain region.

18. An integrated circuit including a gate-all-around transistor, the integrated circuit comprising:
   a nanowire or nanoribbon including a first material comprising semiconductor material;
   a gate structure wrapped around the nanowire or nanoribbon, the gate structure including a gate electrode and a gate dielectric, the gate dielectric between the gate electrode and the nanowire or nanoribbon;
   a source region and a drain region, the nanowire or nanoribbon between the source and drain regions, the source and drain regions including a second material comprising semiconductor material; and
   a third material distinct from the first and second materials, the third material adjacent to at least one of the source or drain regions, the at least one of the source or drain regions between the third material and the nanowire or nanoribbon, wherein the third material has a linear coefficient of thermal expansion (CTE) value that is either greater than 5 parts per million per degree Celsius (ppm/° C.) at around 20° C. or less than 0 ppm/° C. at around 20° C.

19. The integrated circuit of claim 18, wherein the third material has a linear CTE value that is greater than 5 ppm/° C. at around 20° C.

20. The integrated circuit of claim 18, wherein the third material is in direct contact with the at least one of the source region or the drain region.

\* \* \* \* \*